United States Patent [19]

Ohhashi et al.

[11] Patent Number: 5,693,203

[45] Date of Patent: Dec. 2, 1997

[54] SPUTTERING TARGET ASSEMBLY HAVING SOLID-PHASE BONDED INTERFACE

[75] Inventors: Tateo Ohhashi; Hideaki Fukuyo; Ichiroh Sawamura; Kenichirou Nakamura; Atsushi Fukushima; Masaru Nagasawa, all of Kitaibaraka, Japan

[73] Assignee: Japan Energy Corporation, Tokyo, Japan

[21] Appl. No.: 306,057

[22] Filed: Sep. 14, 1994

Related U.S. Application Data

[63] Continuation-in-part of Ser. No. 122,738, Sep. 16, 1993.

[30] Foreign Application Priority Data

| Sep. 29, 1992 | [JP] | Japan | 4-282297 |
| Nov. 24, 1992 | [JP] | Japan | 4-334899 |
| Dec. 7, 1992 | [JP] | Japan | 4-351106 |

[51] Int. Cl.$^6$ .................................................. C23C 14/34
[52] U.S. Cl. ........................ 204/298.12; 204/298.13; 428/652; 428/660; 428/662; 428/663; 428/661; 428/673; 428/680; 428/674
[58] Field of Search ................... 204/298.12, 298.13; 428/652, 660, 662, 663, 661, 673, 680, 674

[56] References Cited

U.S. PATENT DOCUMENTS

| 4,341,816 | 7/1982 | Lauterbach et al. | 204/298.12 |
| 5,032,468 | 7/1991 | Dumont et al. | 204/298.13 |
| 5,160,388 | 11/1992 | Legnesy et al. | 204/298.13 |
| 5,230,459 | 7/1993 | Mueller et al. | 204/298.12 |
| 5,244,556 | 9/1993 | Inoue | 204/192.12 |

FOREIGN PATENT DOCUMENTS

| A10342894 | 11/1989 | European Pat. Off. . | |
| 1-283367 | 11/1989 | Japan | 204/298.13 |

OTHER PUBLICATIONS

European Search Report dated Jan. 3, 1994 with respect to European Patent Application EP 93307621.8.
Patent Abstracts of Japan, C section, vol. 16, No. 419, Sep. 3, 1992, The Patent Office Japanese Government, No. 04-143 268 (Fujitsu Ltd), p. 38 C 981.
Patent Abstracts of Japan, C section, vol. 16, No. 419, Sep. 3, 1992, The Patent Office Japanese Government, No. 04-143 269 (Fujitsu Ltd), p. 38 C 981.

*Primary Examiner*—R. Bruce Breneman
*Assistant Examiner*—Rodney G. McDonald
*Attorney, Agent, or Firm*—Panitch Schwarze Jacobs & Nadel, P.C.

[57] ABSTRACT

A sputtering target assembly composed of a sputtering target and a backing plate with or without an insert or inserts interposed therebetween as necessary characterized by having solid-phase bonded interface accompanied with no appreciable thermal diffusion layer and by said sputtering target substantially maintaining the quality characteristics including metallurgical characteristics and properties that the sputtering target had before it was bonded to the backing plate intact. The sputtering target assembly is obtained by solid-phase bonding the target and backing plate, with or without one or more insert sandwiched therebetween, at a low temperature and a low pressure under a vacuum. The solid-phase bonded interface gives reliable bonds of a bonded area percentage of 100% without non-bonded portions such as pores. The uniformity of microstructure and crystal orientation etc. of a target material is maintained intact with the suppression of crystal grain growth.

3 Claims, 6 Drawing Sheets

[FIG. 4]
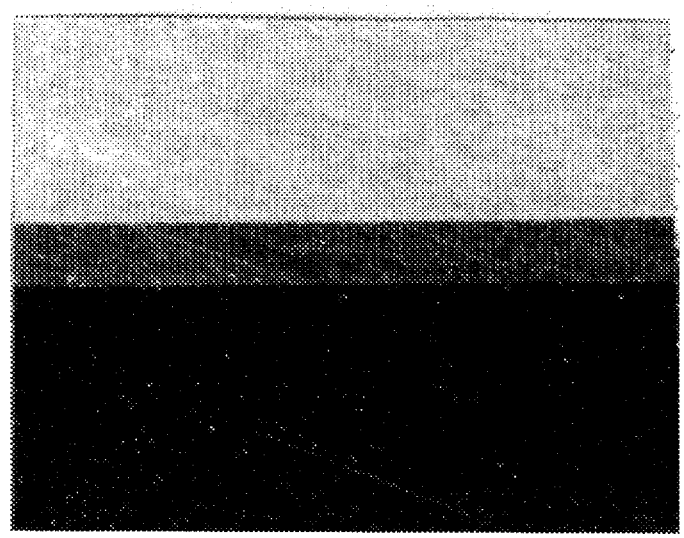

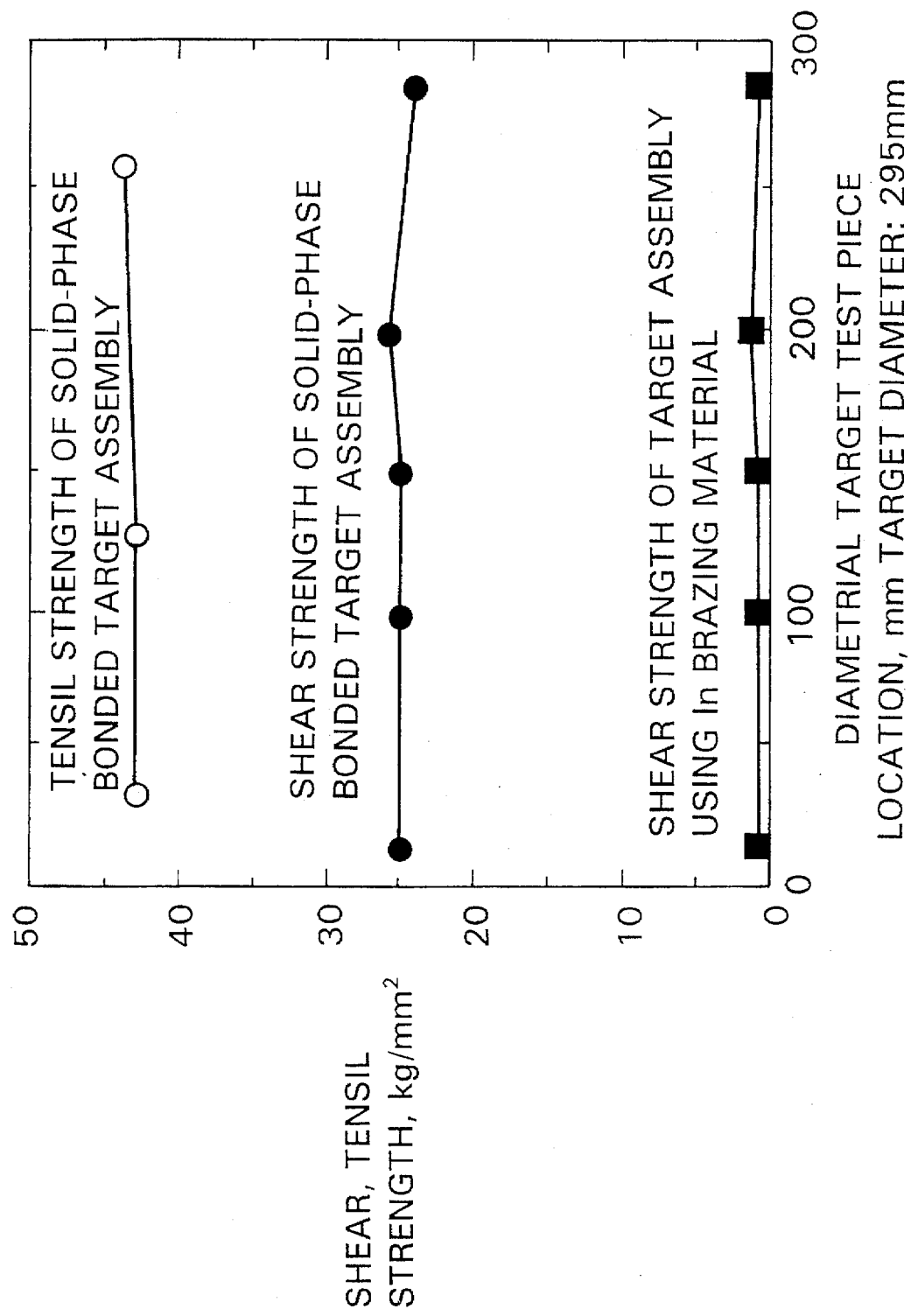

[FIG. 6]
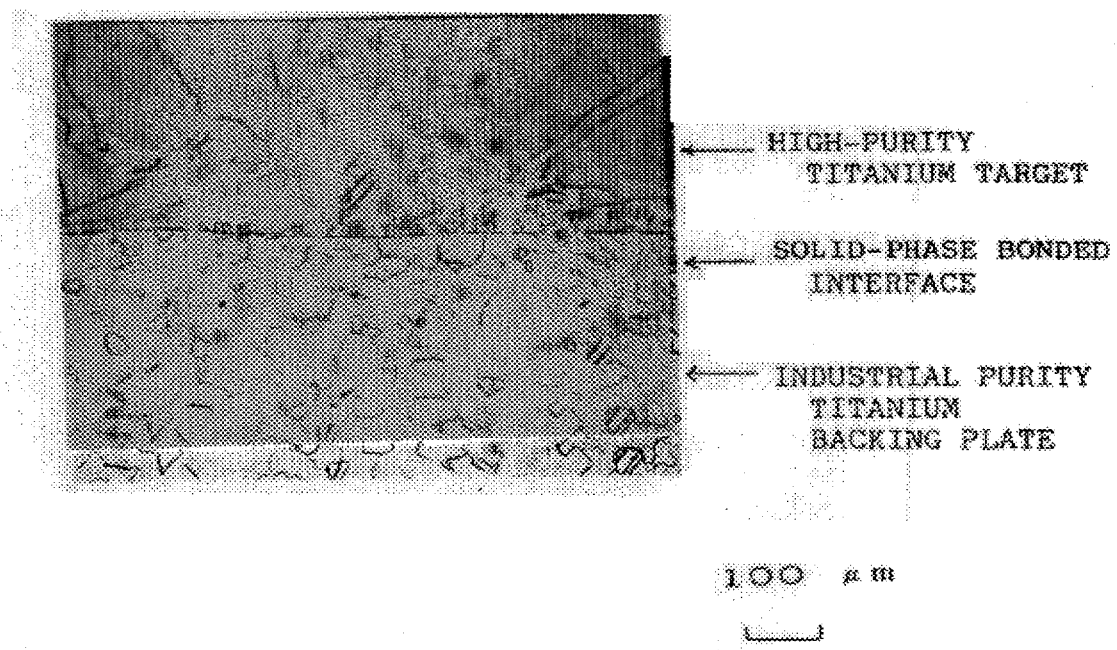

SPUTTERING TARGET ASSEMBLY HAVING SOLID-PHASE BONDED INTERFACE

[CROSS-REFERENCE TO RELATED APPLICATION]

This application is a continuation-in-part of our application Ser. No. 08/122,738, filed Sep. 16, 1993.

[FIELD OF THE INVENTION]

This invention relates to a sputtering target assembly composed of a sputtering target and a backing plate having solid-phase bonded interface with or without an insert or inserts placed therebetween, said solid-phase bonded interface having no appreciable thermal diffusion layer.

[BACKGROUND OF THE INVENTION]

Sputtering targets serve as sputtering sources to form electrodes, gates, wirings, elements, protective films and the like of various semiconductor devices on substrates by sputtering operation. They usually take the form of disk-shaped plates. As accelerated particles impinge against a target surface, some of the atoms constituting the target are sputtered into space by momentum exchange, and deposit on an oppositely located substrate. Typical sputtering targets in use include Al and Al alloy targets, a refractory metal and its alloy (W, Mo, Ti, Ta, Zr, Nb, etc. and their alloys such as W—Ti) targets, and high-melting-point silicide ($MoSi_x$, $WSi_x$, etc.) targets. The targets are usually used in the form of assembly integrally bonded with a backing support, known as a backing plate, which provides both support and cooling functions. A sputtering target assembly is mounted in a sputtering system, and the rear side of the backing plate is cooled to dissipate the heat that is generated in the target during sputtering operation. The backing plates in use today are made of metals and alloys with good thermal conductivities, such as oxygen-free copper (OFC), Cu alloys, Al alloys, stainless steels (SUS), and Ti and Ti alloys.

Heretofore, for the bonding of a sputtering target (merely called target hereinafter) and a backing plate to constitute a sputtering target assembly, brazing method using a low-melting point brazing material such as In or Sn alloy has been primarily adopted. The main reason thereof is that in exchanging a used sputtering target assembly for a new sputtering target assembly, the brazing method permits the backing plate of the used target assembly to be reused. Specifically, as the sputtering of a target is conducted, the surface of the target is eroded progressively deeper till the erosion reaches near the bottom face of the target, and the used target assembly must be exchanged for a new target assembly. In exchange of a target assembly, it is desired to exchange a used target only for a new target while reusing the backing plate of the used target assembly. In the brazing method using a low-melting point brazing material, since the melting point of brazing material is relatively low as found in the fact that the melting point of In is 158° C. and the melting point of Sn based alloys is in the range of 160° to 300° C., by heating the used target assembly above the melting point of a brazing material used, it is possible to separate the target and backing plate of the used target assembly and to bond a new target to the backing plate of the used target assembly.

Recently, VLSI devices have a trend toward the refinement of the width of wirings to a sub-micron level and multi-layered wiring structure having four or more layers. In addition, due to such refined and multilayered wiring structure, in VLSI devices, contact holes connecting MOS or bipolar regions of the lowermost layer thereof to bit wirings and via holes connecting the top and bottom wirings also become smaller in diameter corresponding to the refinement of the wiring width with increased aspect ratios (depth/diameter) of the holes of 4 or more. For the reason, in the case where such refined and multi-layered wiring structures are formed with a conventional film forming process, the time period required for film formation increases in proportion to the number of wiring layers. A collimation sputtering process has recently been developed as a useful technique for filling contact holes and via holes having high aspect ratios, but this process uses a collimator between a sputtering target assembly and a substrate onto which a film is to be sputtered and so has a low film formation speed characteristics. Therefore, with this collimation sputtering process, a problem also occurs that the efficiency of device production drops.

As an approach for eliminating these problems, it is strongly required as an actual means to use an increased input power for enhancing the film formation speed.

However, toward the use of a higher input power, the brazing technique using a low-melting point brazing material has the following disadvantages:

(1) The low-melting point of brazing materials, 158° C. for In or 160°–300° C. for an Sn alloy, causes a sharp drop of the bond strength as the service temperatures approaches its melting point and the bond strength near the melting point approximately becomes zero. As a result, when a sputtering system is loaded with greater sputtering power than one adopted previously, or when the system is operated under inadequate cooling water control, troubles such as the separation of the target are caused due to a decrease in bond strength upon temperature rise of the target or melting of the brazing material.

(2) With the brazing technique, 100% bonding without non-bonded portions is difficult to achieve since the contraction upon solidification of the brazing material during the bonding process leaves pores (air gaps) behind along the bonded interfaces between the target and backing plate. The non-bonded portions hamper the heat transfer from the target to backing plate.

As the result, a target assembly having a low-melting point brazing material to provide bonding between a target and a backing plate cannot cope with the recent trend of using greater input power for sputtering. In view of this, there is strong demand for the development of a new target assembly which is capable of maintaining the bond strength above a predetermined level even at elevated temperatures and can cope with higher input power.

Under such background, Japanese Patent Application Public Disclosure Nos. 143268/1992 and 143269/1992 disclose targets and methods of manufacturing them which involve a process of integrally bonding a first metal member that serves as a sputtering material to a second metal member that serves as a support, either directly or through the interposition of a spacer having a higher melting point than the first metal member. As regards the method of integrally bonding them together, explosive welding is primarily explained. Other bonding methods referred to as employable are hot press, HIP, and hot roll methods. Taking the hot press method for example, it is described as comprising the steps of working and machining, e.g., an Al-1% Si alloy as the first metal member (sputtering material) and oxygen-free copper as the second metal member (support), both to relatively simple shapes, and bonding the two members by hot pressing at 300°–500° C. for 60 minutes, whereby a diffusion layer of about 2 μm thickness is said to be formed, and thereafter machining the first and second metal members (sputtering material and support) thus bonded together to final configurations. It is also stated to the effect that alternatively the first and second metal members having been machined to desired shapes may be bonded by explosive welding.

U.S. Pat. No. 5,244,556 states that a target plate is directly connected to a backing plate by an explosive cladding process (column 4, lines 40 to 42).

Further, U.S. Pat. No. 5,230,459 discloses a method of preparing a bonded sputter target/backing plate assembly comprising forming a plurality of grooves in one of said mating surfaces, positioning the target and backing plate adjacent each other and heating and pressing them under a vacuum, inert or reducing atmosphere so that the grooves are filled with a metal or alloy from the other of the mating surfaces. Specifically, it is stated that a target having a plurality of concentric and serrated grooves and a backing plate having a flat surface are set within a vacuum capsule so that they are superposed to each other and they are bonded by HIP at a temperature 550° to 625° C. and under a pressure of 2000 to 15000 psi.

Japanese Patent Application Public Disclosure No. 1-283367 describes the bonding of a target and a backing plate by the use of explosive bonding, resistance welding, (seam welding) using electrode rollers, hot rolling and diffusion bonding.

Thus, prior art for bonding a target to a backing plate to constitute a target assembly chiefly includes (1) explosive bonding process and hot rolling process, (2) ordinary HIP process and hot pressing process and (3) grooved process. But, these processes inherently involve the following disadvantages and problems:

(1) Explosive bonding, Hot rolling:

By these technique a target and a backing plate are strongly and forcibly pressed together and bonded to each other under a very great impact or heavy load. However, since the pressure being applied during bonding is not simultaneously and uniformly loaded over the entire surface to be bonded, the bonding proceeds with a directivity in any direction to the bonding interface. Therefore, the target material is subjected to uneven deformation, with destruction of the uniformity of recrystallized structure and crystal orientation of the target, resulting in different microstructures (crystal grain size etc.) and different crystal orientations at various locations of the target. As a result, the quantity of sputter from the target will vary from point to point, which leads to variation in deposited film thickness and hence deposited film properties. This problem has recently been pointed out to be a matter of serious concern.

(2) Ordinary HIP, Hot press:

Generally, the surfaces of a target and a backing plate are contaminated with oxidized layer and adsorbed gases to form a surface degraded layer, which strongly hampers the bonding thereof as is well known. For this reason, in conducting the ordinary HIP process and hot press process, the surfaces of the target and backing plate to be bonded are cleaned before the bonding and are subjected to a high vacuum atmosphere for preventing the re-oxidation during the bonding and to a high temperature for enhancing the deformability and diffusion ability of the materials to be bonded so that the surface degraded layer may be destroyed and absorbed into the materials to thereby expose a fresh surface at the bonding interface for bonding. Thus, in these processes, the use of a higher bonding temperature becomes essential for obtaining sound bonding. However, increased bonding temperature causes a change in the microstructure of the target material, for example, coarsening of crystal grain diameter and change of crystal orientation. Also, in bonding a Ti target to an Al backing plate, for example, brittle intermetallic compound is easily formed at the interface thereof due to thermal diffusion thereof under a high temperature involved resulting in problems of remarkable drop of the bonding strength and others.

(3) Grooved process (U.S. Pat. No. 5,230,459)

This process proposes to promote the bonding by forming grooves at the target side bonding surface for example while making the backing plate side bonding surface flat so that the grooves are filled with metal of the backing plate when the grooved surface and the flat surface are pressed against each other in HIP or hot press process. But, during bonding, strong stresses are generated at the grooves and the target is subjected to uneven deformation with accompanying destruction or disordering of the recrystallized structure and crystal orientation of the target, resulting in different microstructures and different crystal orientations at various locations of the target as in the above explosive process.

Although seam welding using roller electrodes and diffusion bonding are also mentioned in Japanese Patent Application Public Disclosure No. 1-283367, the same problems as discussed above still occurs since the bonding interface is subjected to a high temperature and a high pressure.

[OBJECT OF THE INVENTION]

The present invention has for its object the development of a technique for bonding a target to a backing plate with a high strength while imparting no unfavorable effects such as appreciable deformation and change of microstructure upon the target material itself and simultaneously maintaining the uniformity of microstructure of the target.

[SUMMARY OF THE INVENTION]

The present inventors have searched for a method for bonding a target to a backing plate which can prevent the deterioration of quality characteristics such as crystal grain growth, the change of crystal orientation and others and cause little deformation or other adverse effects upon the target material. As a result, it has now been found that solid-phase bonding under specified bonding atmosphere, pressure and temperature conditions, with the use of an insert or inserts if required, produces a far better bond than expected at the interface thereof. The solid-phase bonding is performed while maintaining a solid phase under a light pressure load and a relatively low temperature in a vacuum to provide solid-phase bonded interface accompanied with no appreciable thermal diffusion layer between the target and the backing plate or otherwise between the insert and the target and between the insert and the backing plate if the insert is used. As a result, a target assembly produced has high adhesion and high bond strength accompanied with no appreciable deformation and uneven deformation of the target material and without non-bonded portions such as pores along the interface or interfaces, while substantially maintaining the crystal characteristics which the target material had before the bonding intact resulting in inhibiting the destruction of uniform microstructure, the growth of crystal grains, the change of crystal orientation etc.

The sputtering target is made of a material selected from the group consisting of a refractory metal of W, Mo, Ti, Ta, Zr and Nb and refractory metal-based alloys, silicides of the refractory metal, and Al and Al alloys.

The backing plate is made of a material selected from the group consisting of Cu and Cu alloys, Al and Al alloys, stainless steels, and Ti and Ti alloys.

The insert or inserts are selected from the group consisting of Al or its alloys, Ag or its alloys, Cu or its alloys and Ni or its alloys depending upon a combination of target material and a backing plate material.

The expression "solid-phase bonded interface accompanied with no appreciable used herein mean layer" as used herein means that the interface generated between the bonding surfaces of constituent elements of a target and a backing plate and an insert if the insert is used, using HIP, hot pressing etc. under specified bonding atmosphere, pressure and temperature conditions has no appreciable thermal diffusion layer across the interface. When two kind of materials are subjected to ordinary diffusion bonding, a thermal diffusion layer is evidently found across their interface as the result that atoms constituting the two materials have diffused across the interface by thermal driving force due to a high temperature (heat) applied, but in contrast, the solid-phase bonded interface of the present invention has substantially no appreciable thermal diffusion layer or has a width of no more than 1 µm even if it is observable since the diffusion of atoms across the interface does not occur substantially due to a lower temperature involved. Therefore, the expression "solid-phase bonded interface accompanied with no appreciable thermal diffusion layer" is defined as the interface formed by the solid-phase bonding having no observable thermal diffusion layer or having a thermal diffusion layer of no more than 1 µm in width even if it is observable.

In other word, the "solid-phase bonded interface accompanied with no appreciable thermal diffusion layer" is one attained using technique of bonding a target and a backing plate with or without an insert sandwiched therebetween, the bonding surfaces of the target, backing plate and insert having been degreased and cleaned and preferably having been as smoothened as possible, by subjecting them to light heating and light pressing conditions under a vacuum atmosphere, whereby the two members are bonded while maintaining the solid phase rather than being melted and without generating thermal diffusion layer across the interface thereof. If the mutual thermal diffusion occurs across the interface of the materials to be bonded, it is disadvantageous in the it promotes the formation of brittle intermetallic compound at the interface.

The solid-phase bonding of this invention provides many advantages: Such light heating not only inhibits the generation of thermal diffusion layer, but also prevents the coarsening of crystal grains of the target material. Such light pressure condition suppress the deterioration of quality characteristics of the target material including the change of crystal orientation caused by a large deformation and uneven deformation etc. of the target material.

Based upon this discovery, this invention provides a sputtering target assembly composed of a sputtering target and a backing plate with or without an insert or inserts interposed therebetween as necessary depending on the combination of the materials of the sputtering target and the backing plate characterized by having solid-phase bonded interface accompanied with no appreciable thermal diffusion layer and by said sputtering target substantially maintaining the quality characteristics including metallurgical characteristics and properties that the sputtering target had before it was bonded to the backing plate intact.

Specifically, this invention, in its first aspect, provides:
(1) a sputtering target assembly composed of three-layer structure of a sputtering target and a backing plate with one or more inserts interposed therebetween, the sputtering target and the insert and the backing plate having bonded interfaces therebetween, wherein the sputtering target is made of a material selected from the group consisting of a refractory metal of W, Mo, Ti, Ta, Zr and Nb and refractory metal-based alloys, silicides of the refractory metal, and Al and Al alloys; said backing plate is made of a material selected from the group consisting of Cu and Cu alloys, Al and Al alloys, stainless steels, and Ti and Ti alloys; and said insert is made of a material selected from the group consisting of Cu and Cu alloys, Al and Al alloys, Ag and Ag alloys, and Ni and Ni alloys, characterized by said bonded interfaces being solid-phase bonded interfaces accompanied with no appreciable thermal diffusion layers and by said sputtering target having uniform microstructure having crystal grain sizes of no more than 350 µm, said target assembly having been formed by solid-phase bonding under the conditions of a vacuum of 1 Pa or less, a pressure load of 1 to 20 kg/mm$^2$ and a temperature of 150° to 350° C. so that the coarsening of crystal grains and the change of crystal orientation in the target are prevented, and (2) the sputtering target assembly of (1) wherein said insert is formed by coating an insert material on either or both of said sputtering target and said backing plate or inserting an insert material in a foil or sheet form between the sputtering target and said backing plate before conducting the solid-phase bonding.

In a combination of a target material of W, Mo, Ti, Ta, Zr, and Nb and a alloy thereof target material and a a backing plate of Ti or its alloy, we have found that the solid-phase bonding can be achieved without the use of insert. Then, this invention, in a second aspect, provides:

(3) a sputtering target assembly composed of two-layer structure of a sputtering target and a backing plate having an bonded interface therebetween wherein the sputtering target is made of a material selected from the group consisting of a refractory metal of W, Mo, Ti, Ta, Zr and Nb and refractory metal-based alloys and said backing plate is made of a material selected from the group consisting of Ti and Ti alloys characterized by said bonded interface being solid-phase bonded interface accompanied with no appreciable thermal diffusion layer and by said target having uniform microstructure having crystal grain sizes of no more than 350 µm, said target assembly having been formed by solid-phase bonding under the conditions of a vacuum of 1 Pa or less, a pressure load of 1 to 20 kg/mm$^2$ and temperature of 150° to 550° C. so that the coarsening of crystal grains and the change of crystal orientation in the target are prevented.

Thus, a sputtering target assembly having solid-phase bonded interface accompanied with no thermal diffusion layer of this invention provides 100% bonding without non-bonded portions such as pores left along the interfaces by solid-phase bonding of the target and backing plate, with or without one or more inserts sandwiched therebetween, at a low temperature and a low pressure while suppressing the crystal grain growth in the target material, and deformation and change of the target material with no or little diffusion of their constituent atoms to thereby attain high adhesion and bond strength of the target material to the backing plate. The bond thus obtained proves highly reliable because it undergoes no abrupt decrease in bond strength upon elevation of the service temperature.

[BRIEF EXPLANATION OF THE DRAWINGS]

FIG. 4 is a micrograph showing the metallographic structure in the vicinity of bonded interfaces of a target assembly consisting of Al-1%Si-0.5%Cu target, Ag foil and an OFC backing plate according to this invention as described in Example 1.

FIG. 5 is a graph showing the bond strength values under shear and tensile bond strength values at room temperature of the solid-phase bonded target assembly consisting of a titanium target solid-phase bonded to a backing plate of titanium of this invention with those of the target assembly that used an In brazing metal in Example 6.

FIG. 6 is a micrograph showing the metallographic structure in the vicinity of the bonded interface of an target assembly consisting of a titanium target solid-phase bonded to a backing plate of titanium in Example 6.

[EXPLANATION OF PREFERRED EMBODIMENTS]

Figure 1:
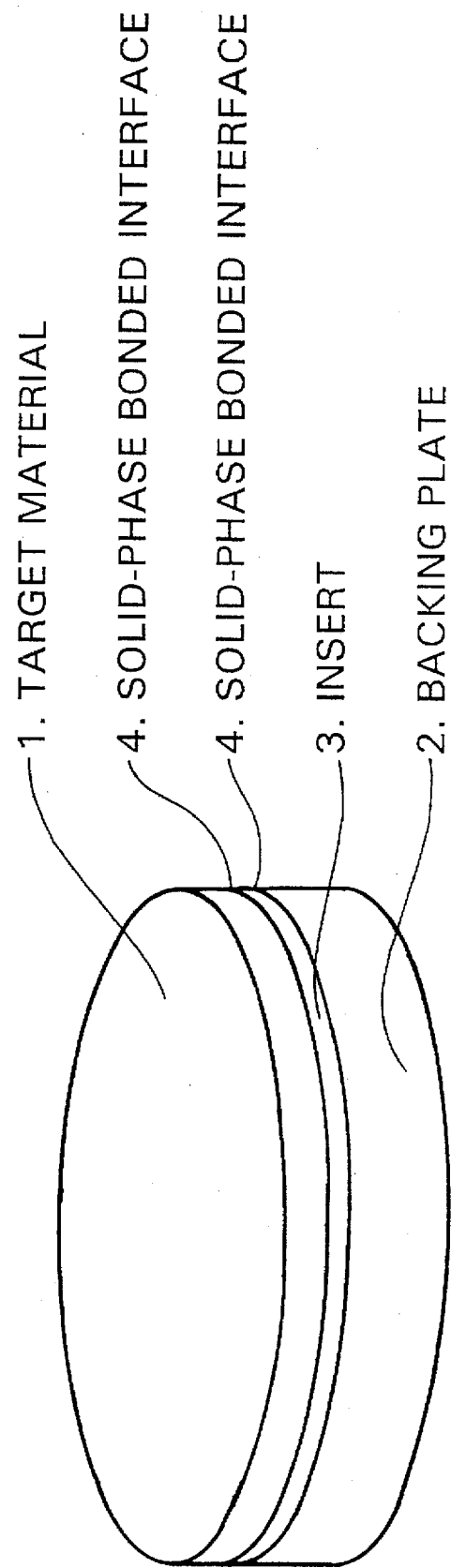
FIG. 1 is a perspective view of a sputtering target assembly having solid-phase bonded interface accompanied with no appreciable thermal diffusion layer consisting of a target and a backing plate bonded through an insert in accordance with this invention.

There is shown in FIG. 1 a solid-phase bonded sputtering target assembly which is composed of a target 1 and a backing plate 2 through an insert 3 in accordance with an embodiment of this invention. The components are solidly bonded with solid-phase bonded interfaces 4 accompanied with no appreciable thermal diffusion layer. The insert 3 may be omitted depending upon a combination of the materials of the target and the backing plate. In this case, the target 1 and the backing plate 2 directly forms their solid-phase bonded interface accompanied with no appreciable thermal diffusion layer. The target maintains the metallurgical characteristics and properties such as crystal grain size, crystal orientation etc. that it had before diffusion bonding intact.

In this invention, the sputtering target is made of a material selected from the group consisting of a refractory metal of W, Mo, Ti, Ta, Zr and Nb, refractory metal-based alloys such as W—Ti, and high melting point compounds including silicides of the refractory metal such as $MoSi_x$, $WSi_x$ which has a melting point of no less than 1000°C. and Al and Al alloys which has a melting point of no more than 1000° C. The backing plate is made of a material selected from the group consisting of Cu such as oxygen-free copper and Cu alloys, Al and Al alloys, stainless steels, and Ti and Ti alloys. The insert is made of a material selected from the group consisting of Cu and Cu alloys, Al and Al alloys, Ag and Ag alloys, and Ni and Ni alloys. While one insert may be used, but two or more inserts may be used in layers.

In the combination of a W, Mo, Ti, Ta, Zr or Nb target material and a Ti or Ti alloy backing plate material, the solid-phase bonding is permitted without use of an insert.

In fabricating a sputtering target assembly with the use of insert(s), a backing plate and a target are degreased and rinsed with an organic solvent like acetone. Preferably, it is recommendable that they have the smoothened bonding surfaces. Then, between the two is interposed an insert or inserts in a sheet or foil form of one or more materials chosen from among Ag, Cu, Ni, and their alloys, desirably having at least 10 µm thickness. Otherwise, such insert material may be coated either or both of the target and the backing plate. When an insert in a sheet or foil form is used, the insert too must be degreased and rinsed beforehand. The reason why the use of a 10 µm or thicker insert is desirable is that when solid-phase bonding is conducted, the insert can deform at the interface between the target and backing plate so that surface degraded layers such as oxide layers, gas adsorbed layers etc. on the bonding surfaces that the insert contacts are destroyed resulting in exposing fresh surfaces at the bonding interface whereby metallic bond is caused at the bonding interface of the target and the backing plate to form solid-phase bonding. When the thickness of the insert is below 10 µm, the deformability of the insert does not become adequate so that the surface degraded layer is insufficiently destroyed resulting in lowering of the bonding strength. The upper limit of thickness of the insert is not critical provided the insert is thick enough for solid-phase bonding, but excessive thickness is wasteful. A normally used foil or thin sheet may be used and also a coating film provided by plating, vapor deposition, sputtering etc. also may be employed. For the material of the insert, it is necessary to have a high deformability and Ag, Cu, Ni, or their alloy which is a soft material is suitable as referred to above. Two or more superposed layers may be used. The surfaces of the insert should be free from oxides or other impurities.

In the combination of a target material selected from a melting refractory metal of W, Mo, Ti, Ta, Zr and Nb, refractory metal-based alloys such as W—Ti, and high melting point compounds including silicides of the refractory metal such as $MoSi_x$, $WSi_x$ which has a melting point of no less than 1000° C. and Al and Al alloys which has a melting point of no more than 1000° C., a backing plate selected from the group consisting of Cu such as oxygen-free copper and Cu alloys, Al and Al alloys, stainless steels, and Ti and Ti alloys and an insert selected from the group consisting of Cu and Cu alloys, Al and Al alloys, Ag and Ag alloys, and Ni and Ni alloys, a laminate consisting of a target, a backing plate and an insert or inserts is generally bonded in a solid state by holding it at a constant temperature within a bonding temperature range of 150°–350° C., preferably of 150°–250° C., and at a pressure of 1.0–15 kg/mm², preferably 3–10 kg/cm² under a vacuum of 1 Pa or below. In this way, a sputtering target assembly having a solid-phase bonded interface with no appreciable thermal diffusion layer between the target and the backing plate or between the insert and the target and having uniform microstructure having crystal grain sizes of no more than 350 µm, while preventing the coarsening of crystal grains and the change of crystal orientation of the target material is obtained. The term "microstructure" means crystallographic microstructure chiefly associated with crystal grains.

To avoid the formation of oxides, the bonding is carried out in a vacuum atmosphere of 1 Pa or below. The reason why the bonding temperature is set within 150°–350°C is based on the following reasons. If it exceeds 350° C., because of the difference in thermal expansion rate between the target and backing plate, there is a tendency to warp or distort with a large shearing force at the interface, leading to inadequate bonding. In Al or Al alloy, crystal grain growth takes place in the target material. On the other hand, if it is below 150° C., the deformability of the insert becomes insufficient resulting in inadequate destruction of the surface degraded layer with poor bonding. With regard to the pressure load to be applied, which is necessary to effect the deformation of the insert for destroying the degraded layer, it is selected depending upon the deformability of the insert used at the bonding temperature adopted. The pressure load must be at least 1.0 kg/mm² at 350° C. of the maximum temperature. Accompanied with the lower bonding temperature, a higher load pressure becomes necessary. At a load pressure beyond 15 kg/mm², there is a danger that incurs a large deformation of the target material.

In the combination of a W, Mo, Ti, Ta, Zr or Nb target material and a Ti or Ti alloy backing plate material, the solid-phase bonding is permitted without use of an insert and a target assembly having a solid-phase bonded interface with no appreciable diffusion layer is obtained by holding them at a temperature within the range of 150°–550° C., and at a pressure of 1.0–15 kg/mm², preferably 3–10 kg/cm² under a vacuum of 1 Pa or below. In this way, a sputtering target assembly with no thermal diffusion layer between the target and the backing plate and having uniform microstructure having crystal grain sizes of no more than 350 μm, while preventing the coarsening of crystal grains and the change of crystal orientation of the target material is obtained. To avoid the formation of oxides, the bonding is carried out also herein in a vacuum atmosphere of 1 Pa or below. The pressure load must be at least 1.0 kg/mm² at the maximum temperature of 550° C. Even accompanied with the lower bonding temperature, a relatively higher load pressure becomes necessary. At a load pressure beyond 15 kg/mm², there is a danger that incurs a large deformation of the target material. The bonding temperature is set desirably within the range of 150°–550° C. for the following reasons. If it is below 150° C., the materials of the target and the backing plate exhibit poor deformability and the destruction of the surface degraded layer becomes insufficient which results in poor bonding. If it exceeds 550° C., grain growth tends to occur in the target material.

The sputtering target assembly having a solid-phase bonded interface accompanied with no thermal diffusion layer thus obtained shows no deterioration of the target material, has bonded interfaces with a bonding area percentage of 100% produced by liquid phase-free solid phase bonding, and can satisfactorily be used even in a high-power sputtering system.

To reduce the adsorbed water, gas and the like on the target surface, it is possible to bake the target itself at about 200° C. before use unlike the case where a low-melting brazing filler metal is used.

[EXAMPLES]

Further explanations will be made with the Examples. The Examples set forth herein are merely for illustration and do not intend any restriction of this invention.

(Example 1)

An Al-1%Si-0.5%Cu target in the form of a disk 300 mm in diameter and an oxygen-free copper (OFC) backing plate of the same size were ultrasonically degreased and rinsed with acetone. An insert of Ag foil 100 μm thick was used. The insert, after the ultrasonic degreasing and rinsing with acetone, was sandwiched between the Al-1%Si0.5%Cu target and the OFC backing plate.

The laminate consisting of the Al-1%Si-0.5%Cu target, Ag foil insert, and OFC backing plate was solid-phase bonded in a vacuum of 5×10⁻³ Pa, at a bonding temperature of 250° C. and under a load of 8 kg/mm². The grain size of the target after the bonding was 150 μm. When the bonding temperature only was increased to 450° C., the grain size of the target after the bonding was 500 μm.

Figure 2:
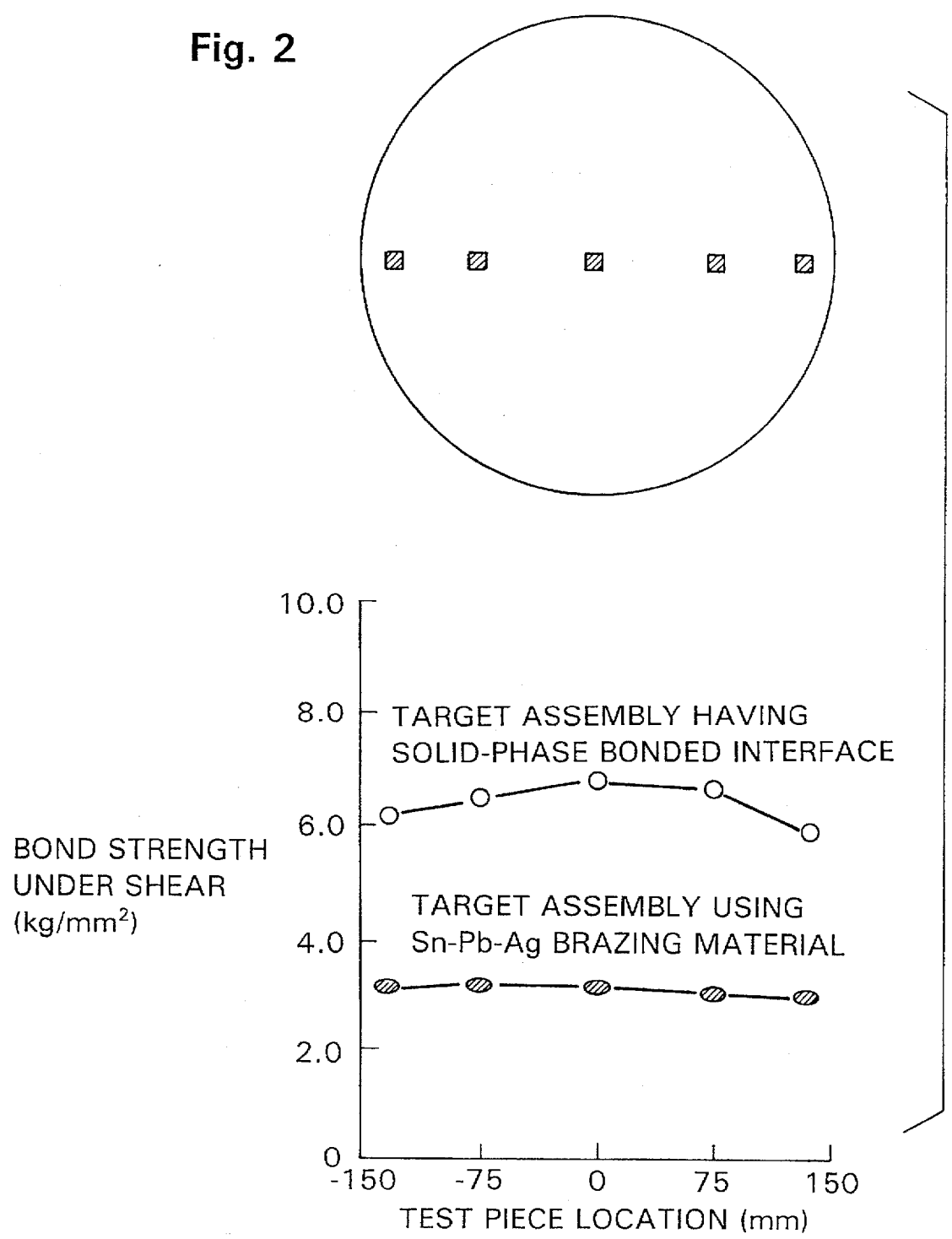
FIG. 2 is a graph comparing the bond strength values under shear at room temperature of a target assembly with the solid-phase bonded interface substantially accompanied with no thermal diffusion layer of this invention with those of a target assembly that used a low-melting point brazing material of the Sn—Pb—Ag system in Example 1.
Figure 3:
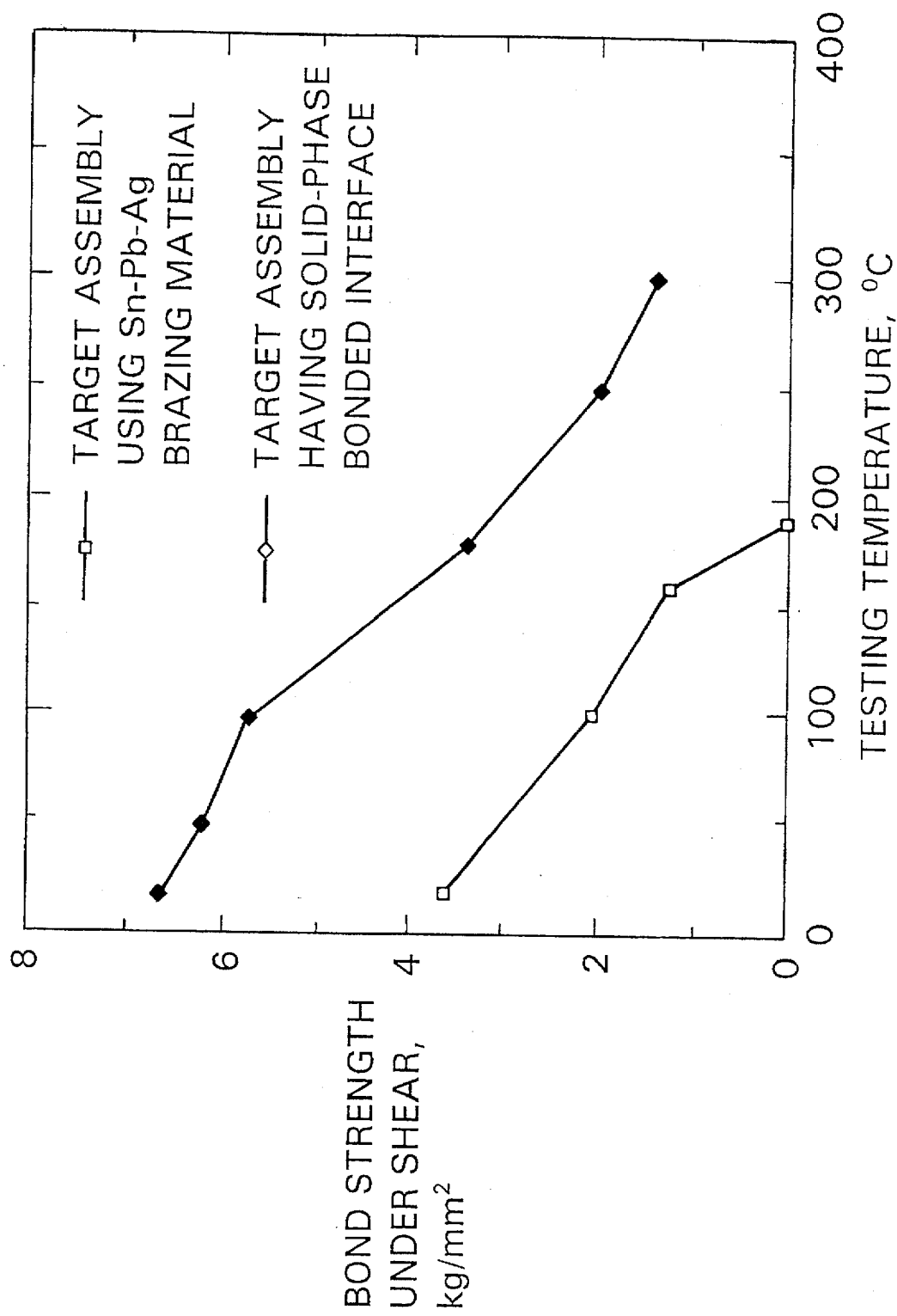
FIG. 3 is a graph showing the temperature dependence of the bond strength values under shear of each target assembly of Example 1.

The bond strength values under shear at room temperature of test pieces cut out of five different diametral points of the target assembly obtained are compared, in FIG. 2, with those of corresponding test pieces of a target assembly consisting of the same Al-1%Si-0.5%Cu target and OFC backing plate but with an ordinary low-melting point brazing material of the Sn—Pb—Ag system. FIG. 3 shows the temperature dependence of the bond strength values under shear of these target assembly. As is obvious from FIGS. 2 and 3, the bond strength under shear of the target assembly using the Sn—Pb—Ag low-melting point brazing material is about 3 kg/mm², while the target assembly having solid-phase bonded interface in accordance with this invention has about twice the strength, the values being around 6 kg/mm². As for the temperature dependence, the bond strength under shear of the target assembly using the Sn—Pb—Ag low-melting brazing material becomes zero in the vicinity of 180° C. which is the melting point of the brazing material itself. The solid-phase bonded target assembly of this invention, by contrast, exhibits a bond strength under shear of 3 kg/mm² or more above 200° C. and retains a strength of 2 kg/mm² even at 250° C. FIG. 4 is a micrograph of a cross section illustrating the bond interfaces and neighboring portions of the target assembly composed of an Al-1%Si-0.5%Cu target, Ag foil, and OFC backing plate according to the present invention. In the interfaces, thermal diffusion layers were not observed.

(Example 2)

Target assembly was made by solid-phase bonding in the same manner as described in Example 1 with the exception that inserts of copper foil and nickel foil were respectively used instead. Similar effects were achieved.

(Example 3)

A Ti target in the form of a disk 300 mm in diameter and a SUS (stainless steel) backing plate of the same size were ultrasonically degreased and rinsed with acetone. An insert of Ag foil 100 μm thick was used. The insert, after the ultrasonic degreasing and rinsing with acetone, was sandwiched between the Ti target and the SUS backing plate.

The laminate consisting of the Ti target material, Ag foil insert, and SUS backing plate was bonded in a vacuum of 5×10⁻³ Pa, at a bonding temperature of 250° C., and under a load of 8 kg/mm². The grain size of the target after bonding was 70 μm. In the interfaces, thermal diffusion layers were not observed.

As in Example 1, the bond strength values under shear at room temperature of test pieces cut out of five different diametral points of the solid-phase bonded target assembly are compared with those of corresponding test pieces of a target assembly consisting of the same Ti target material and SUS backing plate but with an ordinary low-melting point brazing material of the Sn—Pb—Ag system. A similar result as in FIG. 2 was obtained. The temperature dependence of the bond strength values under shear of these bonded materials was also similar as in FIG. 3. Namely, the bond strength under shear of the target assembly using the Sn—Pb—Ag low-melting point brazing material is about 3 kg/mm², while the solid phase bonded target assembly in accordance with this invention has about twice the strength, the values being around 6 kg/mm². As for the temperature dependence, the bond strength under shear of the target assembly using the Sn—Pb—Ag low-melting point brazing material becomes zero in the vicinity of 180° C. which is the melting point of the brazing material itself. The solid-phase bonded target assembly of this invention, by contrast, exhibits a bond strength under shear of 3 kg/mm² or more above 200° C. and retains a strength of 2 kg/mm² even at 250° C.

(Example 4)

Target assembly having solid-phase bonded interface of this invention was made similarly to Example 3 but using an insert of a copper foil or nickel foil. Similar effects were attained.

(Example 5)

A tungsten target of high purity (>99.999%) in the form of a disk 295 mm in diameter was solid phase bonded to a titanium backing plate of industrial purity in a vacuum of $5\times10^{-3}$ Pa, at a bonding temperature of 500° C., and under a load of 8 kg/mm$^2$. Under micrograph observation of a cross section of the bond interface of the bonded target assembly thus obtained, it could be confirmed that interface having the bonded area percentage of 100% without non-bonded portions such as pores was obtained. In the interface, a thermal diffusion layer was not observed. The bond strength under shear at room temperature of test pieces cut out from five diametral points in the manner described in Example 3 was 25 kg/mm$^2$. On the other hand, the tensile bond strength of test pieces was 45 kg/mm$^2$. The bond strength under shear at room temperature of test pieces cut out similarly of a target assembly bonded using an In brazing material was at a level of as lower as of 1 kg/mm$^2$. This difference verifies the superiority of a target assembly having solid-phase bonded interface of this invention.

(Example 6)

A high-purity (>99.999% ) titanium target in the form of a disk 295 mm in diameter was solid-phase bonded to a titanium backing plate of industrial purity directly without the use of an insert under a vacuum of $5\times10^{-3}$ Pa and at a bonding temperature of 500° C., load of 7.5 kg/mm$^2$. Strain rate was $2\times10^{-5}$/sec. In FIG. 5 are compared the bond strengths at room temperature of a target assembly made by solid-phase bonding in accordance with this invention with that of a target assembly which used an In brazing material wherein the test pieces were cut out from five diametral points in the manner described in Example 3. A micrograph of the bond interface of the bonded assembly is shown in FIG. 6. The crystal grain size of the target after bonding was 50 μm. The photograph clearly indicates that the interface had attained 100% bonding without non-bonded portions such as pores. In the interface, a thermal diffusion layer was not observed. As found in FIG. 5, the test piece at room temperature exhibited a bond strength under shear of 25 kg/mm$^2$ and a tensile strength under shear of 43 kg/mm$^2$. The piece of In brazing material-bonded target assembly gave a bond strength under shear at a low level of 1 kg/mm$^2$. This test verifies the superiority of a target assembly having solid-phase bonded interface with no appreciable thermal diffusion layer.

[ADVANTAGES OF THE INVENTION]

A target assembly of this invention has a solid-phase bonded interface with no appreciable thermal diffusion layer since it was produced by solid-phase bonding at a lower temperature and a more uniform and lower pressure than in conventional processes and has the following features:
(1) The uniformity of microstructure and crystal orientation etc. of a target material is maintained intact with the suppression of crystal grain growth.
(2) High degrees of adhesion and bond strength are obtainable.
(3) The sharp drop of bond strength is avoided as found in the rise of the service temperature that can occur with a low-melting point brazing material.
(4) Solid-phase bonded interface gives reliable bonds of a bonded area percentage of 100% without non-bonded portions such as pores that can result from ordinary bonding, due to shrinkage on solidification of a brazing material.

Consequently, this invention offers advantages as follows:
(a) A target material can be bonded to a backing plate without the possible danger of being damaged;
(b) Uniformity of sputtering is ensured with the result that the film thickness is kept constant and the film properties are made uniform and stable;
(c) A greater electric power can be used for sputtering, and therefore the throughput for film forming by sputtering can be improved; and
(d) The target itself can be baked at around 200° C., thus reducing adsorbed water, gas, and the like on the target surface.

What we claim is:

1. A three-layer sputtering target assembly comprising a sputtering target, a backing plate and at least one insert interposed therebetween, the sputtering target, the at least one insert and the backing plate having bonded interfaces therebetween, wherein the sputtering target is made of a material selected from the group consisting of a refractory metal of W, Mo, Ti, Ta, Zr and Nb, refractory metal-based alloys, silicides of the refractory metal, and Al and Al alloys; said backing plate is made of a material selected from the group consisting of Cu and Cu alloys, Al and Al alloys, stainless steels, and Ti and Ti alloys; and said at least one insert is made of a material selected from the group consisting of Cu and Cu alloys, Al and Al alloys, Ag and Ag alloys, and Ni and Ni alloys, characterized by said bonded interfaces being solid-phase bonded interfaces wherein any thermal diffusion layer present at said bonded interface has a thickness of 0–1 μm, and by said sputtering target having uniform microstructure and crystal orientation with crystal grain sizes of no more than 350 μm, with the provisio that no bonded interface has facing materials selected from the group consisting of Al and Al alloys, said target assembly having been formed by solid-phase bonding under the conditions of a vacuum of 1 Pa or less, a pressure load of 1 to 20 kg/mm$^2$ and a temperature of 150° to 350° C. so that the coarsening of crystal grains and the change of crystal orientation in the target material are prevented.

2. The sputtering target assembly of the claim 1 wherein said insert is formed by coating an insert material on either or both of said sputtering target and said backing plate or inserting and insert material in a foil or sheet form between the sputtering target and said backing plate before conducting the solid-phase bonding.

3. A two-layer sputtering target assembly comprising a sputtering target and a backing plate with a bonded interface therebetween, wherein said sputtering target is made of a material selected from the group consisting of a refractory metal of W, Mo, Ti, Ta, Zr and Nb and refractory metal-based alloys, said backing plate is made of a material selected from the group consisting of Ti and Ti alloys, characterized by said bonded interface being a solid-phase bonded interface wherein any thermal diffusion layer present at said bonded interface has a thickness of 0–1 μm, and by said target having uniform microstructure and crystal orientation with crystal grain sizes of no more than 350 μm, said target assembly having been formed by solid-phase bonding under the conditions of a vacuum of 1 Pa or less, a pressure load of 1 to 20 kg/mm$^2$ and temperature of 150° to 550° C. so that the coarsening of crystal grains and the change of crystal orientation in the target material are prevented.

* * * * *